United States Patent
Okada et al.

(10) Patent No.: US 6,307,002 B1
(45) Date of Patent: Oct. 23, 2001

(54) POLYIMIDE COMPOSITION AND PROCESS FOR PRODUCING THE SAME

(75) Inventors: Kohji Okada; Hitoshi Nojiri, both of Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/436,359

(22) Filed: Nov. 9, 1999

(30) Foreign Application Priority Data

Nov. 9, 1998 (JP) .................................................. 10-317370
Jan. 8, 1999 (JP) .................................................. 11-003485

(51) Int. Cl.$^7$ ............................. C08G 73/10; C08G 69/28
(52) U.S. Cl. ...................... 528/170; 528/125; 528/126; 528/128; 528/171; 528/172; 528/173; 528/174; 528/176; 528/183; 528/190; 528/191; 528/220; 52/224; 52/229; 52/350; 52/353; 525/420; 525/422; 522/164
(58) Field of Search ...................................... 528/353, 183, 528/190, 172, 171, 173, 174, 176, 191, 350, 125, 126, 128, 220, 224, 229; 522/164; 525/420, 422

(56) References Cited

U.S. PATENT DOCUMENTS

| | | | |
|---|---|---|---|
| 5,866,627 | * | 2/1999 | Czornyj et al. ........................ 528/353 |
| 6,025,461 | * | 2/2000 | Chiang et al. ........................ 528/353 |
| 6,096,850 | * | 8/2000 | Chiang et al. ........................ 528/353 |

FOREIGN PATENT DOCUMENTS 2 723099    2/1996 (FR).

OTHER PUBLICATIONS

Berrada, "Photoinduced Polymerization of Bisimides as Models for New Soluble Side–Chain–Substituted Negative-–Type Photosensitive Polyimides", Chem. Matter, vol. 8, No. 5 1996, pp. 1022–1028 The month in the date of publication is not available.

Berrada, "Novel Negative–Type Soluble Photosensitive Polyimides: Synthesis and Characterization", Chem. Matter vol. 8, No. 5, 1996, pp. 1029–1034 The month in the date of publication is not available.

* cited by examiner

*Primary Examiner*—P. Hampton-Hightower
(74) *Attorney, Agent, or Firm*—Pillsbury Winthrop LLP

(57) ABSTRACT

A polyimide represented by the following general formula (1);

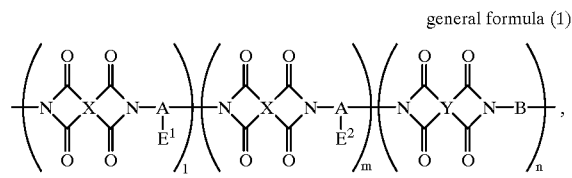

general formula (1)

wherein l, m, and n represent not the order of each repeating unit, but the numbers of each repeating unit existing in the molecule, $E^1$ is a photosensitive group, $E^2$ is a group comprising an alkyl group having 2 to 20 carbon atoms, —A(—$E^1$)—, —A(—$E^2$)—, and B each are a divalent organic group, X and Y each are a tetravalent organic group, X, Y, A, B, $E^1$ and $E^2$ may be identical or different among the repeating units, l is an integer of 1 or more, m and n each are an integer of 0 or more. The polyimide and polyimide compositions comprising it has thermoreactivity as well as photoreactivity and photosensitivity.

14 Claims, No Drawings

POLYIMIDE COMPOSITION AND PROCESS FOR PRODUCING THE SAME

BACKGROUND OF THE INVENTION

1. Field of the Invention

The present invention relates to novel polymide compositions and to processes for producing thereof. Particularly, the present invention relates to polyimide compositions having photosensitive groups such as cinnamoyl groups and chalcone groups and having both photoreactivity and thermoreactivity specific to a cinnamoyl group.

2. Description of Related Art

Polyimides have been widely used, for example, in the field of electronic communication and OA, appliances as well as in the field of aerospace because they have excellent heat resistance among a variety of organic polymers. In particular, the polyimides have recently been desired to have not only excellent heat resistance but also a variety of performance depending upon their purposes.

Photosensitive polymers can be obtained by a reaction of existing polymers and photosensitive groups functioning as pendant groups. The representative example of the photosensitive polymers prepared by this method is polyvinyl cinnamate invented by Minsk et al., Eastman Kodak Company, which is disclosed in J. Appl. Polymer Sci., 2, 302 (1959). Polyvinyl cinnamate is prepared by the esterification of polyvinyl alcohol using cinnanmic acid chloride. This polymer is irradiated with light to form cyclobutane rings to be crosslinked and cured.

Few polyimides have been known in which photosensitive groups such as cinnamoyl groups, coumarin groups and chalcone groups are directly jointed to their side chains. Furthermore, although such polyimides may be used as thermosetting resins because those photosensitive groups have double bonds, there have been few cases where polyimides are used as thermosetting resins by introducing a cinnamoyl group thereto.

SUMMARY OF THE INVENTION

The object of the present invention is to provide novel polyimide compositions having photosensitive groups and to provide processes for their preparation.

The present inventors have studied intensively and found that their intended objects can be achieved by compositions containing novel polyimides having specific structures, and as a result, they have accomplished the present invention.

A polyimide of the present invention is a polyimide represented by the following general formula (1):

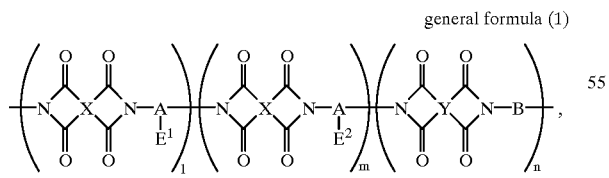

general formula (1)

wherein l, m, and n represent not the order of each repeating unit, but the numbers of each repeating unit existing in the molecule, and $E^1$ is a photosensitive group, $E^2$ is a group containing an alkyl group having 2 to 20 carbon atoms, —A(—$E^1$)—, —A(—$E^2$)— and B each represent a divalent organic group, X and Y each are a tetravalent organic group, X, Y, A, B, $E^1$ and $E^2$ may be identical or different among the repeating units when any one of l, m and n is 2 or more, l is an integer of 1 or more, m and n each are an integer of 0 or more.

In the general formula (1), $E^1$ may be at least one kind of photosensitive groups selected from the group consisting of cinnamic acid derivatives, cinnamylideneacetyl derivatives, chalcone derivatives, stilpyridine derivatives, furylacroyl derivatives, coumarin derivatives, pyrone derivatives and stilbene derivatives.

In the general formula (1), $E^1$ may be at least one kind of photosensitive groups selected from the following group (I):

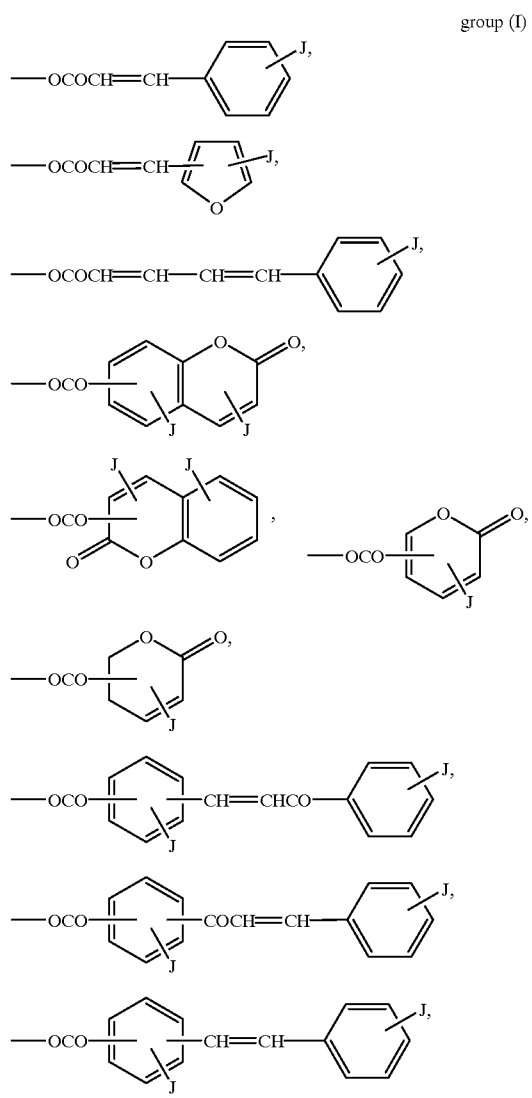

group (I)

wherein J represents H, $CH_3$, $CH_3O$, F, Cl, Br and I.

A polyimide composition of the present invention may contain 20 wt % or more of polyimide(s) selected from any one of polyimides described above.

A process of producing polyimide of the present invention is a process in which the polyimide of the general formula (1) is obtained by: synthesizing a copolymer represented by the following general formula (2)

general formula (2)

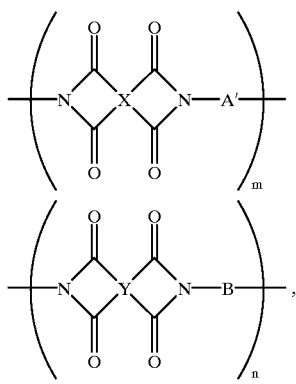

wherein m and n represent not the order of each repeating unit, but the numbers of each repeating unit existing in the molecule, and X and Y each are a tetravalent organic group, A' is a divalent organic group containing at least one hydroxyl group, B is a divalent organic group, X and Y may be identical or different among the repeating units when m is 2 or more, m is an integer of 1 or more, n is an integer of 0 or more; and subsequently introducing photosensitive groups and/or groups containing an alkyl group having 2 to 20 carbon atoms.

The present invention may be a process for producing a polyimide of the foregoing general formula (2), wherein —A'— represents

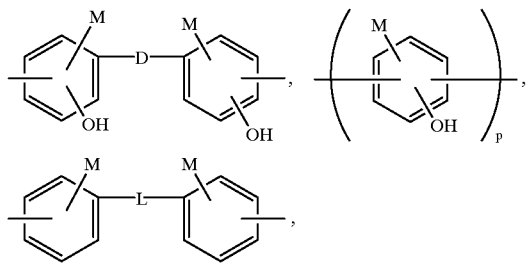

wherein

M represents H, $CH_3$, $CH_3O$, F, Cl, Br, and I;

D represents a single bond, $-C(CF_3)_2-$, $-C(CH_3)_2-$, $-O-$, $-S-$, $-SO_2-$, $-CH_2-$, and $-CO-$;

L represents $-C_nH_{2n-2}(-OH)_2-$, $-O-C_nH_{2n-2}(-OH)_2-O-$, $-C_nH_{2n-1}(-OH)-$, $-O-C_nH_{2n-1}(-OH)-O-$, and

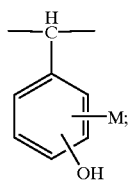

p is an integer of 1 to 3; and n is an integer of 1 to 20.

The present invention may be a process for producing a polyimide in which the polyimide of the general formula (1) is synthesized by reacting a diamine, to which a photosensitive group is introduced, with an acid dianhydride.

Furthermore, the present invention may be a process for producing a polyimide in which the polyimide of the general formula (1) is synthesized by reacting a diamine, to which a photosensitive group is introduced, and a diamine, to which a group containing an alkyl group having 2 to 20 carbon atoms is introduced, with an acid dianhydride.

As mentioned above, the polyimide compositions having photosensitive groups with photoreactivity specific to the photosensitive groups can be provided.

DESCRIPTION OF THE PREFERRED EMBODIMENT

A polyimide composition of the present invention contains a novel polyimide having photosensitive groups such as cinnamic acid, coumarin and chalcone, and having both photoreactivity and thermoreactivity specific to the photosensitive groups. Particularly, the polyimide of the present invention is represented by the general formula (1):

general formula (1)

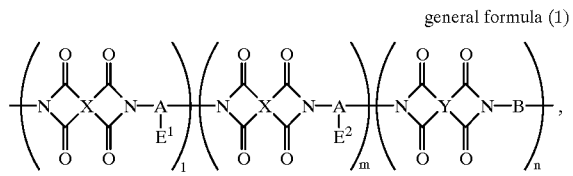

herein , m, and n represent not the order of each repeating unit, but the numbers of each repeating unit existing in the molecule, and $E^1$ is a photosensitive group, $E^2$ is a group containing an alkyl group having 2 to 20 carbon atoms, $-A(-E^1)-$, $-A(-E^2)-$, and B each represent a divalent organic group, X and Y each are a tetravalent organic group, X, Y, A, B, $E^1$, and $E^2$ may be identical or different among the repeating units when any one of l, m and n is 2 or more, l is an integer of 1 or more, m and Ii each are an integer of 0 or more.

A process of producing a novel polyimide and a polyimide composition of the present invention are described in detail below.

The polyimide of the general formula (1) of the present invention can be obtained by the following process.

① There is formed first a polyamic acid, which is a precursor of the polyimide, represented by the general formula (3):

general formula (3)

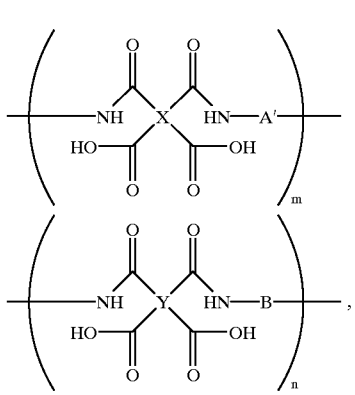

wherein m and n represent not the order of each repeating unit, but the numbers of each repeating unit existing in the molecule, and X and Y each are a tetravalent organic group, A' is a divalent organic group containing at least one hydroxyl group, B is a divalent organic group, X and Y may be identical or different among the repeating units when m is 2 or more, m is an integer of 1 or more, n is an integer of 0 or more, wherein —A'— may be

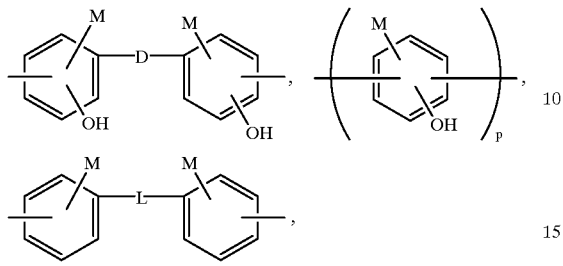

wherein

M represents H, $CH_3$, $CH_3O$, F, Cl, Br and I;

D represents a single bond, —$C(CF_3)_2$—, —$C(CH_3)_2$—, —O—, —S—, —$SO_2$—, —$CH_2$— and —CO—;

L represents —$C_nH_{2n-2}$(—OH)$_2$—, —O—$C_nH_{2n-2}$(—OH)$_2$—O—, —$C_nH_{2n-1}$(—OH)—, —O—$C_nH_{2n-1}$(—OH)—O—, and

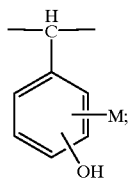

p is an integer of 1 to 3; and n is an integer of 1 to 20.

② Subsequently, a polyimide represented by the general formula (2)

general formula (2)

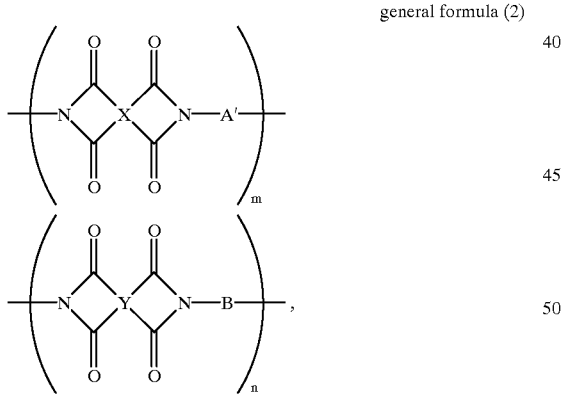

herein m and n represent not the order of each repeating unit, but the numbers of each repeating unit existing in the molecule, and X and Y each are a tetravalent organic groups, A' is a divalent organic group containing at least one hydroxyl group, B is a divalent organic group, X and Y may be identical or different among the repeating units when m is 2 or more, m is an integer of 1 or more, n is an integer of 0 or more, is prepared by dehydration ring-closure of the polyamic acid having the structure represented by the foregoing general formula (3).

③ And then, a photosensitive group and/or a group containing an alkyl group having 2 to 20 carbon atoms are introduced. By this process, there can be provided the polyimide represented by the general formula (1):

general formula (1)

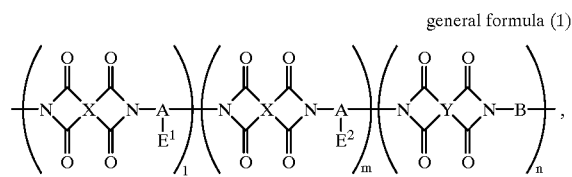

herein l, m, and n represent not the order of each repeating unit, but the numbers of each repeating unit existing in the molecule, and $E^1$ is a photosensitive group, $E^2$ is a group containing an alkyl group having 2 to 20 carbon atoms, —A(—$E^1$)—, —A(—$E^2$)—, and B each represent a divalent organic group, X and Y each are a tetravalent organic group, X, Y, A, B, $E^1$ and $E^2$ may be identical or different among the repeating units when any one of l, m and n is 2 or more, l is an integer of 1 or more, m and n each are an integer of 0 or more.

The foregoing polyamic acid represented by the general formula (3) can be obtained by reacting an acid dianhydride with a diamine component in an organic solvent.

First, under an inert atmosphere such as argon and nitrogen, a diamine represented by the general formula (4):

$H_2N$—A'—$NH_2$ general formula (4)

wherein —A'— represents

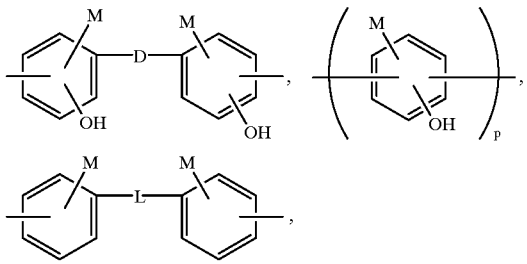

wherein

M represents H, $CH_3$, $CH_3O$, F, Cl, Br and I;

D represents a single bond, —$C(CF_3)_2$—, —$C(CH_3)_2$—, —O—, —S—, —$SO_2$—, —$CH_2$—, and —CO—;

L represents —$C_nH_{2n-2}$(—OH)$_2$—, —O—$C_{2n-2}$(—OH)$_2$—O—, —$C_nH_{2n-1}$(—OH)—, —O—$C_nH_{2n-1}$(—OH)—O—, and

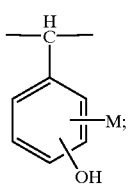

p is an integer of 1 to 3; and n is an integer of 1 to 20, and an acid dianhydride represented by the general formula (5):

general formula (5)

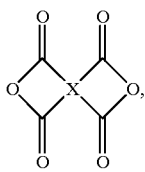

wherein X is one or more kinds of tetravalent organic groups, are dissolved or diffused in an organic solvent. In this case, the use of substantially equivalent molar amounts of the diamine and the acid dianhydride results in a solution of the polyamic acid represented by the general formula (3) wherein m is 100. When the molar rate of the diamine is different from that of the acid dianhydride, a diamine compound represented by the general formula (6):

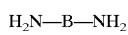 general formula (6)

wherein B represents one or more kinds of divalent organic groups, is added to the acid solution in a state of being dissolved in an organic solvent in a slurry state or in a solid state. To the resulting solution, one or more kinds of acid dianhydride selected from acid dianhydrides represented by the general formula (7):

general formula (7)

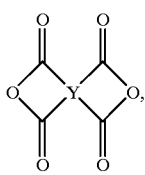

wherein Y is one or more kinds of tetravalent organic groups), is/are added in an organic solvent to prepare a solution of a polyamic acid copolymer. Adjustment of the molar ratio of the acid dianhydride components to the diamine components can optionally provide intended polyamic acid copolymers wherein the relationship between m and n provided in the general formula (3) satisfies m=1 to 100, n=0 to 99, and m+n=100.

As for the order in which the monomers are added, the polyamic acid copolymer solution may be prepared by previously adding the diamine components of the general formulae (4) and (6) to an organic polar solvent, and subsequently adding the acid dianhydride component of the general formula (5), followed by adding the acid dianhydride of the general formula (7). Alternatively, the polyamic acid copolymer solution may also be formed by previously adding the diamine compound of the general formula (6) to an organic polar solvent, subsequently adding the acid dianhydride component of the general formula (5), and then adding the diamine component of the general formula (4), followed by adding the acid dianhydride of the general formula (7). Furthermore, it is also possible to add the diamine components of the general formulae (4) and (6) to an organic polar solvent previously, followed by adding the acid dianhydride components of the general formulae (5) and (7) simultaneously to form the polyamic acid copolymer solution.

Reversing the aforementioned adding procedure to previously add the acid dianhydrides and subsequently add the diamine components provides substantially the same result.

A reaction temperature is preferably −20° C. to 60° C. A reaction time is approximately 30 minutes to 24 hours.

The polyimide represented by the general formula (2) can be prepared by adding a tertiary amine and an azeotropic solvent to the polyamic acid copolymer represented by the general formula (3) as obtained by the foregoing procedure, and conducting dehydration imidization.

Examples of the tertiary amine used in the present invention include alkylamonia derivatives such as triethylamine and tributylamine, pyridine derivatives such as lutidine and picoline, pyridine, isoquinoline, and derivatives thereof, and quinoline.

The azeotropic solvent used in the present invention may be aromatic derivative solvents such as benzene, toluene and xylene, which are used to isolate water by allowing it to azeotrope with water and subsequently being liquefied again using a reflux condenser or the like. The use of the azeotropic solvent makes it possible to remove the water formed in the imidization reaction from the reaction system, and results in the efficient progress of the imidization.

To the resulting solution of the polyimide copolymer represented by the general formula (2), a photosensitive group, or a photosensitive group and a fluoroalkyl group/an alkyl group are introduced. The photosensitive group may be at least one kind of photosensitive groups selected from the group consisting of cinnamic acid derivatives, cinnamylideneacetyl derivatives, chalcone derivatives, stilpyridine derivatives, furylacroyl derivatives, coumarin derivatives, pyrone derivatives, and stilbene derivatives. Concretely, one or more kinds of carboxylic acid or chloride thereof having at least one kind of photosensitive group selected from the following group (I) are added and reacted:

group (I)

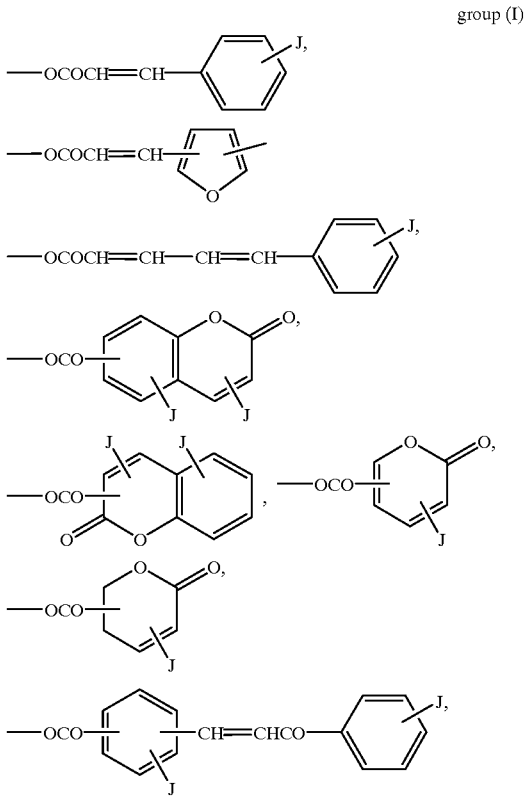

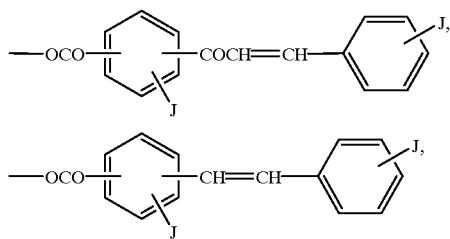

wherein J represents H, CH₃, CH₃O, F, Cl, Br and I.

In order to introduce the alkyl group or the fluoroalkyl group, one or more kinds of carboxylic a-id, sulfonic acid, chloride thereof or the like having an alkyl group having 2 to 20 carbon atoms or a fluoroalkyl group represented by —$C_nH_xF_y$, (wherein n, x and y each are an integer, n is 2 or more and 20 or less, x is 0 or more and 5 or less, and the relationship of x+y=2n+1 is satisfied,) are added and reacted. Concretely, the photosensitive group can be introduced by adding a carboxylic acid or its chloride or the like having the foregoing photosensitive group to the solution of the polyimide copolymer of the general formula (2) and then reacted, or by adding a carboxylic acid having the photosensitive group and a condensing agent for forming an ester bond and reacted. The alkyl group or the fluoroalkyl group can be introduced by adding carboxylic acid, sulfonic acid, chloride thereof or the like having an alkyl group, or alkyl lithium or fluoroalkyl lithium are added to the polyimide copolymer solution of the general formula (2), and reacted under the presence of tertiary amine or the like. Thus, the polyimide represented by the general formula (1) can be obtained by introducing the photosensitive group, the alkyl group, and the fluoroalkyl group. In such a case, the alkyl group or the fluoroalkyl group can be combined to the polyamic acid represented by the general. formula (2) through an ester bond, an ether bond or a sulfonate bond.

Although the acid dianhydrides used for this polyimide, namely the aforementioned acid dianhydrides corresponding to the general formulae (5) and (7), are not particularly limited as long as they are acid dianhydrides, it is desirable that X in the general formula (5) and Y in the general formula (7) each are a divalent organic group having 1 to 3 aromatic rings or an alicyclic group. Concretely, as X in the general formula (5) and Y in the general formula (7), there can be exemplified: acid dianhydrides having organic groups represented by

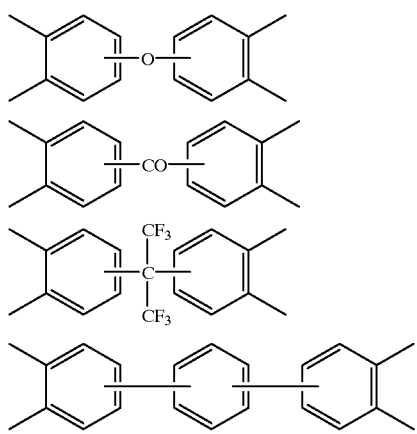

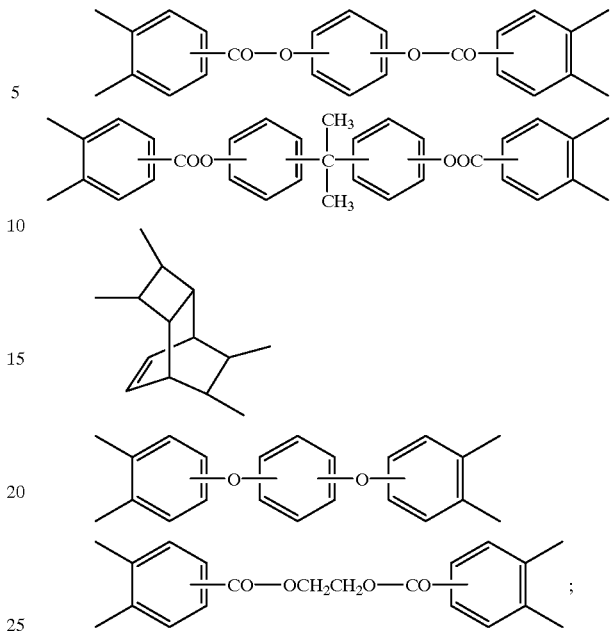

aliphatic or alicyclic tetracarboxylic dianhydrides such as butanetetracarboxylic dianhydride, 1,2,3,4-cyclobutanetetracarboxylic dianhydride, 1,3-dimethyl-1,2,3,4-cyclobutanetetracarboxylic dianhydride, 1,2,3,4-cyclopentanetetracarboxylic dianhydride, 2,3,5-tricarboxycyclopentylacetic dianiydride, 3,5,6-tricarboxynorbonane-2-acetic dianhydride, 2,3,4,5-tetrahydrofurantetracarboxylic dianhydride, 5-(2,5-dioxotetrahydrofural)-3-methyl-3-cyclohexene-1,2-dicarboxylic dianhydride, and bicyclo[2,2,2]-oct-7-ene-2,3,5,6-tetracarboxylic dianhydride;

aromatic tetracarboxylic dianhydrides such as 1,4,5,8-naphthalenetetracarboxylic dianhydride, 2,3,6,7-naphthalenetetracarboxylic dianhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy) diphenylpropane dianhydride, 3,3',4,4'-perfluoroisopropylidendiphthalic, dianhydride, bis (phthalic acid)phenylphosphineoxide dianhydride, p-phenylene-bis(triphenylphthalic acid) dianhydride, m-phenylene-bis(triphenylphthalic acid) dianhydride, bis(triphenylphthalic acid)-4,4'-diphenylether dianhydride, and bis(triphenylphthalic acid) -4,4'-diphenylmethane dianhydride;

aliphatic tetracarboxylic dianhydrides having an aromatic ring such as 1,3,3a,4,5,9b-hexahydro-2,5-dioxo-3-furanyl)-naphtho[1,2-c]furan-1,3-dione, 1,3,3a,4,5,9b-hexahydro-5-methyl-5-(tetrahydro-2,5-dioxo-3-furanyl)-naphtho[1,2-c]furan-1,3-dione, 1,3,3a,4,5,9b-hexahydro-8-methyl-5-(tetrahydro-2,5-dioxo-3-furanyl)-naphtho[1,2-c]furan-1,3-dione, a compound represented by the general formula (8):

general formula (8)

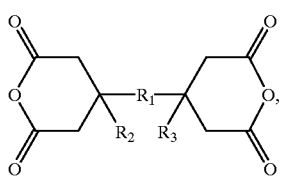

wherein $R_1$ represents a divalent organic group having an aromatic ring and $R_2$ and $R_3$ each represent a hydrogen atom or an alkyl group, and a compound represented by the general formula (9):

general formula (9)

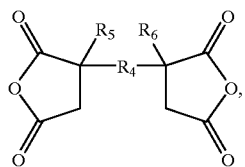

wherein $R_4$ represents a divalent organic group having an aromatic ring, and $R_5$ and $R_6$ each represent a hydrogen atom or an alkyl group). These tetracarboxylic dianhydrides can be used alone or in combination of two or more.

The diamine used for the polyimide composition of the present invention, namely the diamine represented by the general formula (6):

$$H_2N-B-NH_2 \qquad \text{general formula (6)}$$

corresponding to B in the general formula (1), may be a variety of diamines, which is not particularly limited as long as it is a diamine. For example, it is desirable that B in the general formula (6) is 1 to 4 aromatic rings, or 1 to 4 aromatic rings having an alicyclic or siloxane bond, or a divalent organic group having an alicyclic or siloxane bond. Concretely, there can be exemplified diamines of the general formula (6) having, as B in this formula, organic groups represented by

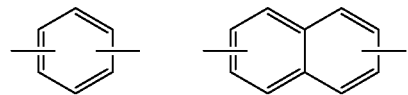

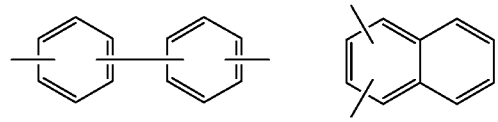

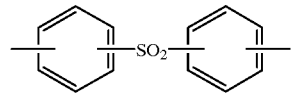

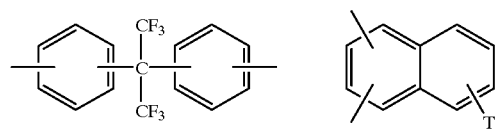

-continued

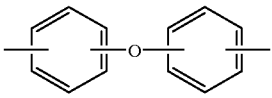

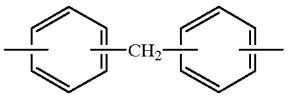

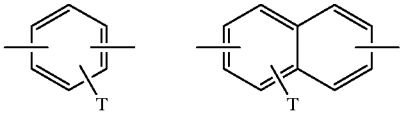

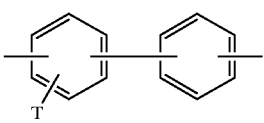 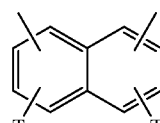

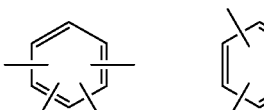 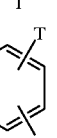

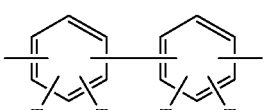

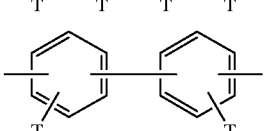

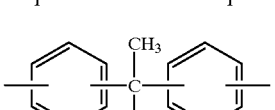

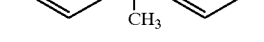 

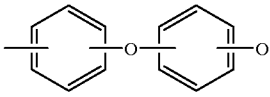

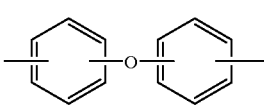

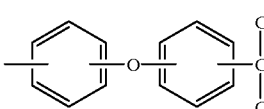

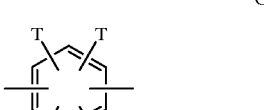

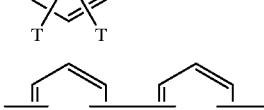

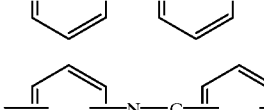

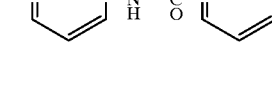

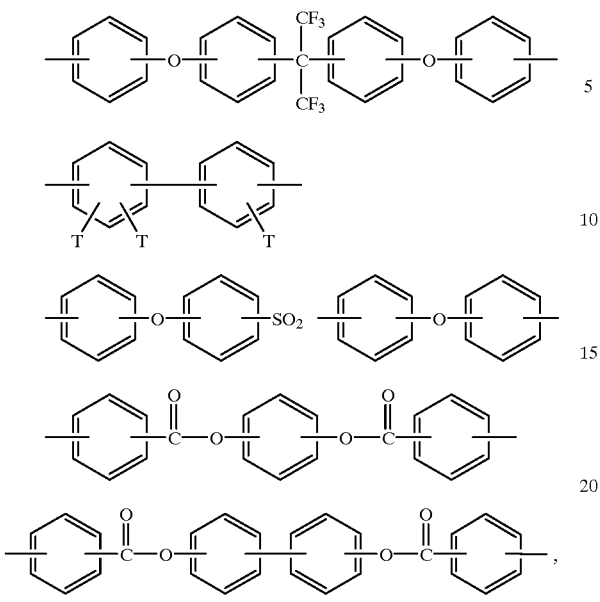

wherein T represents H, CH$_3$, F, Cl, Br and CH$_3$O—;

aromatic diamines such as 4,4'-diaminodiphenylethane, 4,4'-diaminodiphenylsulfide, 1,5-diaminonaphthalene, 3,3-dimethyl-4,4'-diaminobiphenyl, 5-amino-1-(4'-aminophenyl)-1,3,3-trimethylindan, 6-amino-1-(4'-aminophenyl)-1,3,3-trimethylindan, 3,5-diamino-3'-trifluoromethylbenzanilide, 3,5-diamino-4'-trifluoromethylbenzanilide, 3,4'-diaminodiphenyl ether, 2,7-diaminofluorene, 4,4'-methylene-bis(2-chloroaniline), 2,2',5,5'-tetrachloro-4,4'-diaminobiphenyl, 2,2'-dichloro-4,4'-diamino-5,5'-dimethoxybiphenyl, 3,3'-dimethoxy-4,4'-diaminobiphenyl, 4,4'-diamino-2,2'-bis(trifluoromethyl)biphenyl, 9,9-bis(4-aminophenyl)fluorene, 4, 4'-(p-phenyleneisopropylidene) bisaniline, 4,4'-(m-phenyleneisopropylidene)bisaniline, 2,2'-bis[4-(4-amino-2-trifluoromethylphenoxy) phenyl]hexafluoropropane, and 4,4'-bis[4-(4-amino-2-trifluoromethyl)phenoxy]-octafluorobiphenyl;

aromatic diamines having two amino groups and a hetero atom besides the nitrogen atoms of those amino groups linked to aromatic rings such as diaminotetraphenylthiophene;

aliphatic diamines and alicyclic diamines such as 1,1-metaxylilene diamine, 1,3-propane diamine, tetramethylene diamine, pentamethylene diamine, octamethylene diamine, nonamethylene diamine, 4,4-diaminoheptamethylene diamine, 1,4-diaminocyclohexane, isophorone diamine, tetrahydrodicyclopentadienylene diamine, hexahydro-4,7-methanoindanilenedimethylene diamine, tricyclo[6,2,1,0$^{2.7}$]-undecylenedimethyldiamine, and 4,4'-methylene bis(cyclohexylamine);

mono-substituted phenylene diamines represented by the general formula (10):

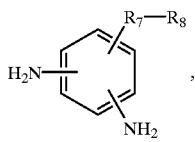

general formula (10)

wherein R$_7$ represents a divalent organic group selected from —O—, —COO—, —OCO—, —CONH—, and —CO—, and R$_8$ represents a monovalent organic group having a steroid skeleton; and compounds represented by the following chemical formula:

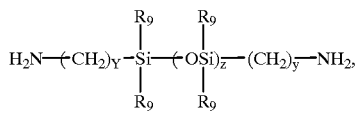

wherein R$_9$ represents a hydrocarbon group having 1 to 12 carbon atoms, y is an integer of 1 to 3, and z is an integer of 1 to 20.

There may also be used diamlines having at least one kind of photosensitive groups selected from the following group (I):

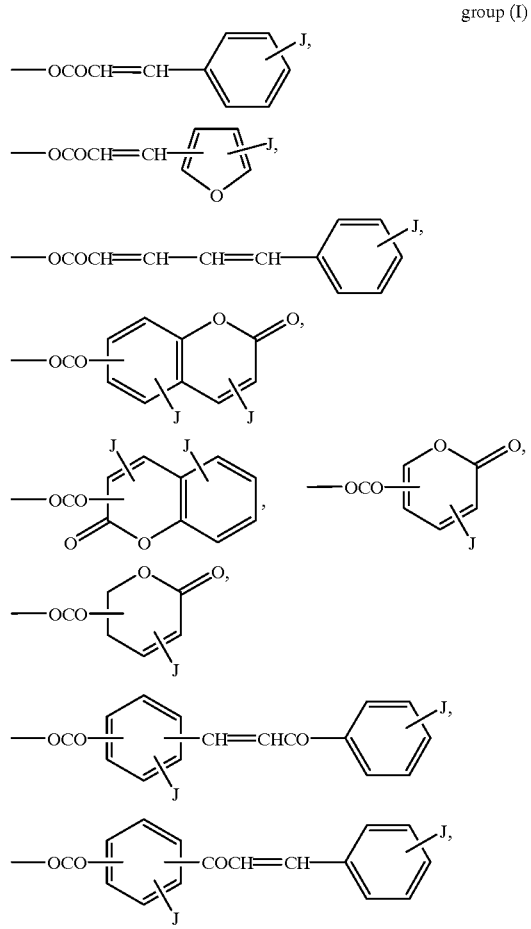

group (I)

-continued

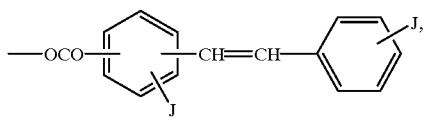

wherein J represents H, CH$_3$, CH$_3$O, F, Cl, Br and I, or having an alkyl group having 2 to 20 carbon atoms, or having a fluoroalkyl group represented by —C$_n$H$_x$F$_y$, wherein n, x and y each are an integer, n is 2 or more and 20 or less, x is 0 or more and 5 or less, and the relationship of x+y=2n+1 is satisfied.

These diamine compounds can be used alone or in combination of two or more.

The polyamic acid preferably has a weigh-average molecular weight of 5,000 to 1,000,000. When the weight-average molecular weight is 5,000 or more, the molecular weight of the resulting polyimide composition is not so small that, for example, the direct use, as a photoreactive resin, of the polyimide composition obtained can maintain mechanical strength of the resin. On the other hand, the molecular weight of 1,000,000 or less can maintain. viscosity of a polyamic acid varnish easy to handle.

It is possible to compound a variety of organic additives, inorganic fillers, or a variety of reinforcing agents to the polyimide.

Examples of the organic polar solvent used in the reaction for forming the polyamic acid include: sulfoxide solvents such as dimethyl sulfoxide and diethyl sulfoxide;

formamide solvents such as N,N-dimethylformamide and N,N-diethylformamide; acetamide solvents such as N,N-dimethylacetamide and N,N-diethrlacetamide; pyrrolidone solvents such as N-methyl-2-pyrrolidone and N-vinyl-2-pyrrolidone; phenol solvents such as phenol, o-, m- or p-cresol, xylenol, halogenated phenol and catechol;

hexamethylphosphoramide and γ-butyrolactone. Although it is desirable that these solvents are used alone or as an admixture thereof, an aromatic hydrocarbon such as xylene and toluene can also be partly used.

Another process for preparing the polyimide of the present invention may be as follows:

① A photosensitive group is introduced by adding a carboxylic acid or its acid chloride having a photosensitive group to dinitro compound represented by

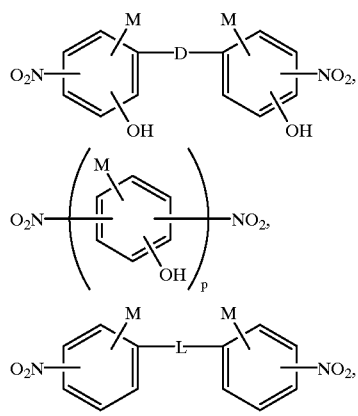

wherein

M represents H, CH$_3$, CH$_3$O, F, Cl, Br and I;
D represents a single bond, —C(CF$_3$)$_2$—, —C(CH$_3$)$_2$—, —O—, —S—, —SO$_2$—, —CH$_2$— and —CO—;
L represents —C$_n$H$_{2n-2}$(—OH)$_2$—, —O—C$_n$H$_{2n-1}$(—OH)$_2$—O—, —CH$_{2n-1}$(—OH)—, —O—C$_n$H$_{2n-1}$(—OH)—O—, and

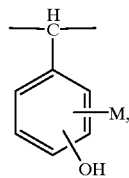

p is an integer of 1 to 3; and
n is an integer of 1 to 20, or by adding a carboxylic acid having a photosensitive group and a condensing agent for forming an ester bond to the foregoing dinitro compound, followed by the reaction there among. Alkyl group od fluoroalkyl group is introduced by adding carboxylic acid, sulfonic acid or their chloride or the like having an alkyl group or a fluoroalkyl group, or
alkyllithium/fluoroalkyllithium to the foregoing dinitro compound under the presence of tertiary amine. In this way, a dinitro compound represented by

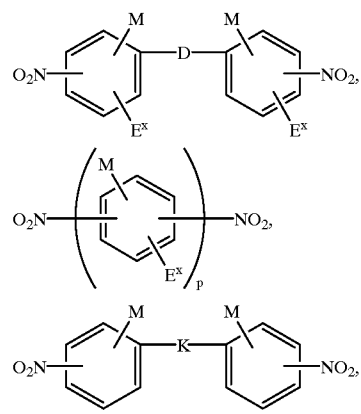

wherein
M represents H, CH$_3$, CH$_3$O, F, Cl, Br and I;
E$^x$ represents E$^1$ and E$^2$;
D represents a single bond, —C(CF$_3$)$_2$—, —C(CH$_3$)$_2$—, —O—, —S—, —SO$_2$—, —CH$_2$— and —CO—;
K represents —CH$_n$H$_{2n-2}$(—E$^x$)$_2$, —O—C$_n$H$_{2n-2}$(—E$^x$)$_2$—O—, —C$_n$H$_{2n-1}$(—E$^x$)—, —O—C$_n$H$_{2n-1}$(—E$^x$)—O—, and

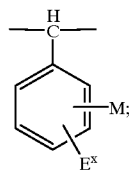

p is an integer of 1 to 3;
n is an integer of 1 to 20;
E$^1$ represents at least one kind of photosensitive group selected from the following group (I):

group (I)

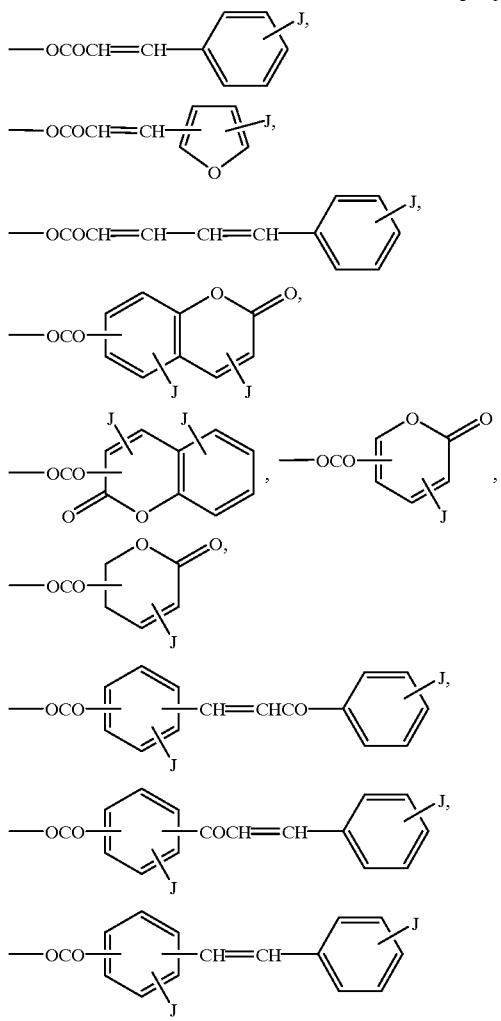

(wherein J represents H, CH$_3$, CH$_3$O, F, Cl, Br and I);

E$^2$ contains either an alkyl group having 2 to 20 carbon atoms or a fluoroalkyl group represented by —C$_n$H$_x$F$_y$ (wherein n, x and y are integers, n is 2 or more and 20 or less, x is 0 or more and 5 or less and the relationship of x+y=2n+1 is satisfied,); and the bond of E$^2$ to A in the foregoing general formula (1) may be an ester bond, a sulfonate bond or an ether bond, can be obtained.

② Subsequently, a diamine represented by

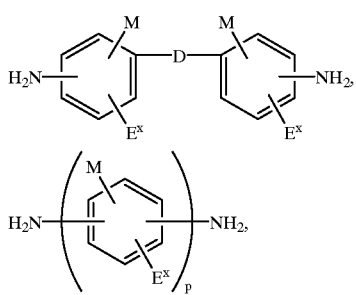

-continued

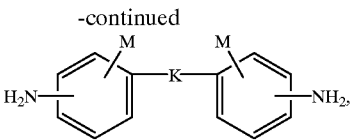

wherein

M represents H, CH$_3$, CH$_3$O, F, Cl, Br and I;

E$^x$ represents E$^1$ and E$^2$;

D represents a single bond, —C(CF$_3$)$_2$—, —C(CH$_3$)$_2$—, —O—, —S—, —SO$_2$—, —CH$_2$—, and —CO—;

K represents —C$_n$H$_{2n-2}$(—E$^x$)$_2$—, —O—C$_n$H$_{2n-2}$(—E$^x$)$_2$—O—, —C$_n$H$_{2n-1}$(—E$^x$)—, —O—C$_n$H$_{2n-1}$(—E$^x$)—O—, and

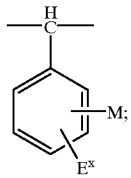

p is an integer of 1 to 3; and.

n is an integer of 1 to 20, is obtained either by Bechamp reduction in which the resulting dinitro compound is reduced by its addition of iron powder to an organic solvent such as acetic acid, or by hydrogenation of the dinitro compound using a catalyst which comprises palladium on activated carbon support and a retarder such as carbon monoxide and sulfur, a catalyst which comprises platinum on carbon black support, or a catalyst which comprises platinum and iron on activated carbon support.

② The polyimide of the general formula (1) can be obtained by reacting the resulting diamine with the acid dianhydride of the general formula (5), the diamine of the general formula (6) or the acid dianhydride of the general formula (7) in the aforementioned procedure to form the polyamic acid, followed by thermal or chemical immidization.

In the present invention, the thermal imidization method is a method in which a tertiary amine and an azeotropic solvent are added to the aforementioned polyamic acid copolymer, followed by conducting dehydration imidization. Although, in general, the thermal imidization method may be performed by only heating to temperatures over 150° C. at which the imidization occurs, heating to temperatures over 180° C. is not desirable because the double bond contained in cinnamic acid or its derivatives reacts at these temperatures. Accordingly, a thermal imidization method in which the aforementioned tertiary amine is added under 180° C. or a chemical imidization method under 180° C. is desirable.

The chemical imidization method is a method in which not less than a stoichiometric amount of dehydrating agent and a catalytic amount of tertiary amine are added to the polyamic acid polymer or its solution, followed by heating to imidate.

The dehydrating agent as used herein may be, for example, aliphatic acid anhydrides such as acetic anhydride and aromatic acid anhydrides. Examples of the catalyst include: aliphatic tertiary amines such as triethylamine; aromatic tertiary amines such as dimethylaniline; heterocyclic tertiary amines such as pyridine, picoline and isoquinoline.

The thus obtained polyimide of the present invention represented by the general formula (1) shows various performance specific to its photosensitive groups when it contains 1 mole % or more of repeating units having a photosensitive group. The more the content of the photosensitive group, the greater the degree of the performance is shown. Therefore, a content of such repeating units is preferably 5 mole % or more, and more preferably 20 mole % or more.

Additionally, the polyimide having a photosensitive group of the present invention represented by the general formula (1) shows photoreactivity more efficiently when it contains 1 mole % or of repeating units having an alkyl group or a fluoroalkyl group. The more the content of the alkyl group or the fluoroalkyl group, the greater the degree of the photoreactivity is shown. Therefore, a content of such repeating units is preferably 5 mole % or more, and more preferably 20 mole % or more.

The more the content of the polyimide of the general formula (1) in the polyimide composition, the better. Accordingly, the content of the polyimide is preferably 20 wt % or more, more preferably 50 wt % or more, and most preferably 80 wt % or more.

The embodiments of the polyimide and the polyimide composition of the present invention have thus been described above, but the present invention is not limited thereto only. The present invention can be materialized in the other embodiments in which various improvements, changes or modifications are made based on the knowledge of those skilled in the art without departing from the concept of the invention.

EXAMPLES

The present invention will be more clearly understood by referring to the Examples below. However, these Examples should not be construed to limit the invention in any way.

In the following Examples, HAB indicates 4,4'-diamino-3,3'-dihydroxybiphenyl, BADP indicates 1,3-bis(4-aminophenoxy)-2,2-dimethylpropane, BAPP indicates 2,2'-bis(4-(4-aminophenoxy) phenyl)propane, ODPA indicates oxydiphthalic acid dianhydride, ESDA indicates 2,2-bis;(4-hydroxyphenyl)propane dibenzoate-3,3',4,4'-tetracarboxylic dianhydride, 6FDA indicates 2,2'-bis(4-phthalic anhydride) hexafluoropropane, DMAc indicates N,N'-dimethylacetamide and NMP indicates N-methyl-2-pyrolidone.

A glass transition temperature Tg was determined by measuring heat quantities ranging from room temperature to 400° C. by a differential scanning calorimeter DSC CELL SCC-41(Shimadzu Corp.) at a heating rate of 10° C. per minute under a nitrogen atmosphere.

Water absorption was calculated from the following equation:

Water absorption (%)=(W2−W1)÷W1×100

In the equation, W1 indicates the weight of the film prepared by drying a test sample of the film at 100° C. for 30 minutes, and W2 indicates the weight of the film prepared by soaking the test sample of the film in distilled water and then wiping away the drops of water from the surface of the film. The test sample used herein had a thickness of 25μm, and was obtained by dissolving polyimide composition in NMP solution, casting it on the glass, drying it at about 120° C for 20 minutes, and then peeling it from the glass.

Weight average molecular weight was determined by gel permeation chromatography (GPC available from Waters Corporation) under the following conditions:

Column: two columns (KD-806M, Shodex),
Temperature: 60° C.
Detector: RI (Refractive Index)
Flow rate: 1 ml per minute
Developer: DMF(0.03M of lithium bromide and 0.03M of phosphoric acid)
Concentration of sample solution: 0.2 wt %
Injection amount: 20 μl
Reference material: polyethylene oxide

Example 1

10.8 g (0.05 mol) of HAB, 14.2 g (0.05 mol) of DABP, and 350 g of DMAc were placed in a 2000 ml separable flask equipped with a stirrer and a reflux condenser with a Dean-Stark trap. 57.65 g (0.1 mol) of ESDA was added at a dash with vigorous stirring, and continuously stirred for 30 minutes.

18.6 g (0.2 mol) of β picoline, 50 g of toluene, and 100 g of DMAc were added to the above reaction solution and heated to about 150° C. Then the water formed by imidization reaction was removed by azeotropy, and the reaction was continuously conducted under a nitrogen atmosphere until water was not generated anymore. After the reaction, the reaction product was isolated by precipitation into methanol, and then it was filtered and dried. Thus 87.5 g of yellow powder (polyimide having a hydroxyl group) was yielded.

74.5 g of the above yellow powder and 104.3 g (0.5 mol) of coumarin-3-carboxylic acid chloride were added to 700 g of NMP and 14.5 g of pyridine, and stirred at room temperature for 30 minutes and at 120° C. for 3 hours. After the reaction, the reaction product was isolated by precipitation into methanol, and then it was filtered and dried. Thus, 77 g of yellow powder (polyimide having a coumarine group) was yielded. The physical properties of the thus-obtained polyimide are shown in TABLE 1.

Example 2

36.63 g (0.1 mol) of 2,2-bis(3-amino-4-hydroxyphenyl) hexafluoropropane and 250 g of DMAc were placed in a 2000 ml separable flask equipped with a stirrer and a reflux condenser with a Dean—Stark trap. 57.65 g (0.1 mol) of ESDA was added at a dash with vigorous stirring, and continuously stirred for an hour.

50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction product was isolated by precipitation into methanol and then it was filtered and dried. Thus 90 g of white powder was yielded. This 90 g of white powder was dissolved in 900 g of NMP, and 83.3 g (0.5 mol) of cinnamoyl chloride was added. Then the solution was stirred at room temperature for 30 minutes and at 120° C. for 3 hours under a nitrogen atmosphere.

After the reaction, the reaction product was isolated by precipitation into methanol, and then it was filtered and dried. Thus 107 g of white powder (polyimide having a cinnamoyl group) was yielded. The physical properties of the thus-obtained polyimide are shown in TABLE 1.

Example 3

29.0 g (0.1 mol) of 4,4'-diamino-4'-hydroxytriphenylmethane synthesized in accordance with a method disclosed in Macromolecules, 29, pp 6427–6431 (1996), and 250 g of DMAC were placed in a 2000 ml separable flask equipped with a stirrer and a reflux condenser with a Dean-Stark trap. 57.65 g (0.1 mol) of ESDA was added at a dash with vigorous stirring, and continuously stirred for an hour.

50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction product was isolated by precipitation into methanol, and then it was filtered and dried. Thus 82.5 g of yellow powder was yielded.

82.5 g of the above yellow powder was dissolved in 800 g of NMP and 83.3 g (0.5 mol)of cinnamoyl chloride was added. Then the solution was stirred at room temperature for 30 minutes and at 120° C. for 3 hours under a nitrogen atmosphere.

After the reaction, the reaction product was isolated by precipitation into methanol, and then it was filtered and dried. Thus 85 g of yellow powder (polyimide having a cinnamoyl group) was yielded. The physical properties of the thus-obtained polyimide are shown in Table 1.

Example 4
(Synthesis of 1,4-bis(3-nitrophenoxy)-2-butanol)

76.51 g (0.55 mol) of 3-nitrophenol, 35.8 g (0.25 mol) of 1,4-dichloro-2-butanol, 600 ml of xylene, and 350 g of potassium carbonate were placed in a reaction vessel and the reaction was conducted under a nitrogen atmosphere for 18 hours. After the reaction, the reaction solution was filtered while it was hot, and the filtered solution was poured into n-hexane to precipitate a yellow solid. Then the yellow solid was filtered, recrystallized, and dried. Thus 50 g of 1,4-bis (3-nitrophenoxy)-2)-Butanol was yielded.
(Synthesis of 1,4-bis(3-aminophenoxy)-2-butanol)

34.8 g (0.1 mol) of the above 1,4-bis(3-nitrophenoxy)-2-butanol, 2 g of 5% palladium-carbon (a catalyst comprising palladium on activated carbon support), and 100 ml of dioxane were placed in a reaction vessel and the hydrogeneration step was carried out by introduction of hydrogen to the reaction vessel at about 60° C. Palladium carbon was isolated by filtration and the filtered solution was concentrated. Thus 28.8 g (0.1 mol) of 1,4-bis(3-aminophenoxy)-2-butanol was yielded.
(Synthesis of polyimide having a hydroxyl group)

250 g of DMAc was placed in a 2000 ml separable flask equipped with a stirrer and a refflux condenser with a Dean-Stark trap. 28.8 g (0.1 mol) of the synthesized 1,4-bis (3-aminophenoxy)-2-butanol and 44.4 g (0.1 mol) of 6FDA were added at a dash with vigorous stirring, and continuously stirred for an hour.

50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction solution was isolated by precipitation into methanol and then it was filtered and dried. Thus 65 g of yellow powder was yielded. This yellow powder was dissolved in 500 g of NMP, and 78.3 g (0.5 mol) of 2-furan acrylic acid chloride was added. Then the solution was stirred at room temperature for 30 minutes and at 120° C. for 3 hours under a nitrogen atmosphere.

After the reaction, the reaction product was isolated by precipitation into methanol, and then it was filtered and dried. Thus 75 g of white powder (polyimide having furan acrylic acid group) was yielded. The physical properties of the thus-obtained polyimide are shown in TABLE 1.

Example 5
(Synthesis of 1,4-bis(3-nitrophenooxy)-2-butancinnamate)

52.2 g (0.15 mol) of 1,4-bis(3-nitrophenoxy)-2-butanol, 33.3 g (0.2 mol) of cinnamoyl chloride, and 800 ml of o-dichlorobenzene were placed in a reaction vessel, and they were reacted at 130° C. for 3 hours under a nitrogen atmosphere. The solution was freed of solvent under reduced pressure and purified by column chromatography. Thus 57.4 g (0.12 mol) of 1,4-bis(3-nitrophenooxy)-2-butancinnamate was yielded.
(Sinthesis of 1,4-bis(3-aminophenoxy)-2-butancinnamate)

23.9 g (50 millimol) of 1,4-bis(3-nitrophenooxy)-2-butancinnamate, 5 g of 5%-platinum-carbon black (about 50% hydrate: a catalyst comprising platinum on carbon black support), 100 ml of 1,4-dioxane were placed in a reaction vessel (hydrogeneration apparatus) and they were heated to 60° C. under a hydrogen atmosphere, with stirring. 7.2 litters of hydrogen was absorbed for 4 hours, and as hydrogen was no longer absorbed, the reaction was stopped. The reaction solution was isolated by filtration. After removing the platinum-carbon, the filtered solution was concentrated and recrystallized, and thus 20.9 g of 1,4-bis(3-aminophenoxy)-2-butancinnamate was yielded.
(Synthesis of polyimide)

250 g of DMAc was placed in a 2000 ml separable flask equipped with a nitrogen introducing tube and a stirrer. 20.9 g (0.1 mol) of the synthesized 1,4-bis(3-aminophenoxy)-2-butane sinnamate and 44.4 g (0.1 mol) of 6FDA were added at a dash with vigorous stirring, and continuously stirred for an hour. Then 100 g of DMAc, 51 g of acetic anhydride, and 23 g of β-picoline were placed in a reaction vessel and they were stirred at a room temperature for 60 minutes and at 120° C. for 60 minutes. After the reaction, the reaction solution was slowly poured into methanol for precipitation, and then filtered and dried. Thus 76 g of yellow solid was yielded. The physical properties of the thus-obtained polyimide are shown in TABLE 1.

Example 6

10.8 g (0.05 mol) of HAB, 14.2 g (0.05 mol) of DABP, and 350 g of DMAc were placed in a 2000 ml separable flask equipped with a stirrer and a reflux condenser with a Dean-Stark trap. Then 57.65 g (0.1 mol) of ESDA was added at a dash with vigorous stirring, and continuously stirred for 30 minutes. 18.6 g (0.2 mol) of β-picoline, 50 g of toluene, and 100 g of DMAc were added to the above reaction solution and heated to about 150° C. Then the water formed by imidization reaction was removed by azeotropy, and the reaction was continuously conducted under a nitrogen atmosphere until water was not generated anymore. After the reaction, the reaction solution was isolated by precipitation into methanol and then it was filtered and dried. Thus 87.5 g of yellow powder (polyimide having a hydroxyl group) was yielded. 82.8 g of the above yellow powder end 14.5 g of pyridine were dissolved in 600 g of NMP. Then 10.4 g (0.05 mol) of coumarin-3-carboxylic acid chloride and 8.8 g (0.05 mol) of pelargonic acid chloride were dissolved and added to the above solution, and stirred at a room temperature for 30 minutes and at 120° C. for 3 hours under a nitrogen atmosphere. After the reaction, the reaction product was isolated by precipitation into methanol, and then it was filtered and dried. Thus 93.5 g of yellow powder (polyimide whose side-chains comprise a coumarine group and an alkyl group) was yielded. The physical properties of the thus-obtained polyimide are shown in TABLE 1.

Example 7

82.8 g of polyimide composition having a hydroxyl group, which is the same polyimide yielded in Example 6, and 14.5 g of pyridine were dissolved in 600 g of NMP. Then 8.4 g (0.05 mol) of cinnamoyl chloride and 8.8 g (0.05 mol) of pelargonic acid chloride were dissolved in 100 g of NMP, added to the above solution, and stirred at a room temperature for 30 minutes and at 120° C. for 3 hours under a nitrogen atmosphere. After the reaction, the reaction product was isolated by precipitation into methanol, and then it was filtered and dried. Thus 92 g of yellow powder (polyimide whose side-chains comprise a cinnamoyl group and an alkyl group) was yielded. The physical properties of the thus-obtained polyimide are shown in TABLE 1.

Example 8

36.63 g (0.1 mol) of 2,2-bis(3-amino-4-hydroxyphenyl) hexafluoropropane and 250 g of DMAc were placed in a 2000 ml separable flask equipped with a stirrer and a reflux condenser with a Dean-Stark trap. Then 57.65 g (0.1 mol) of ESDA was added at a dash with vigorous stirring, and continuously stirred for an hour.

50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction solution was isolated by precipitation into methanol, and then it was filtered and dried. Thus 90 g of white powder was yielded. This white powder was dissolved in 900 g of NMP, and 8.33 g (0.05 mol) of cinnamoyl chloride and 24.1 g (0.05 mol) of $CF_3(CH_2)_7COCl$ were added. Then the solution was stirred at room temperature for 30 minutes and at 120 ° C. for 3 hours under a nitrogen atmosphere.

After the reaction, the reaction product was isolated by precipitation into methanol, and then it: was filtered and dried. Thus 115 g of white powder (polymide whose side-chains comprise a cinnamoyl group and a fluoroalkyl group) was yielded. The physical properties of the thus-obtained polyimide are shown in TABLE 1.

Example 9

29.0 g (0.1 mol) of 4,4'-diamino-4'-hydroxytriphenylmethane synthesized in accordance with a method disclosed in Macromolecules, 29, pp 6427–6431 (1996), and 250 g of DMAc were placed in a 2000 ml separable flask equipped with a stirrer and a reflux condenser with a Dean-Stark trap. 57.65 g (0.1 mol) of ESDA was added at a dash with vigorous stirring, and continuously stirred for an hour.

50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction solution was isolated by precipitation into methanol, and then it was filtered and dried. Thus 82.5 g of yellow solid was yielded. 82.5 g of the above yellow solid was dissolved in 800 g of NMP and 4.17 g (25 millimol) of cinnamoyl chloride and 5.3 g (25 millimol) of n-octylsulfochloride were added. Then the solution was stirred at room temperature for 30 minutes and at 120° C. for 3 hours under a nitrogen atmosphere.

After the reaction, the reaction product was isolated by precipitation into methanol, and then it was filtered and dried. Thus 87 g of yellow powder (polyimide whose side-chains comprise a cinnamoyl group and an alkyl group) was yielded. The physical properties of the thus-obtained polyimide are shown in Table 1.

Example 10

(Synthesis of 1,4-bis(3-nitrophenoxy)-2-butanol)

76.51 g (0.55 mol) of 3-nitrophenol, 35.8 g (0.25 mol) of 4-dichloro-2-butanol, 600 ml of xylene, and 350 g of potassium carbonate were placed in a reaction vessel and the reaction was conducted under a nitrogen atmosphere for 18 hours. After the reaction, the reaction solution was filtered while it was hot, and the filtered solution was poured into n-hexane to precipitate a yellow solid. The yellow solid was filtered, recrystallized, and dried. Thus 50 g of 1,4-bis(3-nitrophenoxy)-2-butanol was yielded.

(Synthesis of 1,4-bis(3-aminophenoxy)-2-butanol)

34.8 g (0.1 mol) of the above 1,4-bis(3-nitrophenoxy)-2-butanol, 2 g of 5% palladium carbon (a catalyst comprising palladium on activated carbon support), and 100 ml of dioxane were placed in a reaction vessel and they were reduced by introduction of hydrogen to the reaction vessel at about 60° C. Palladium-carbon was isolated by filtration and the filtered solution was concentrated. Thus 28.8 g (0.1 mol) of 1,4-bis(3-aminophenoxy)-2-butanol was yielded.

(Synthesis of polyimide having a hydroxyl group)

250 g of DMAc was placed in a 2000 ml separable flask equipped with a stirrer and a reflux condenser with a Dean-Stark trap. Then 28.8 g (0.1 mol) of the synthesized 1,4-bis(3-aminophenoxy)-2-butanol and 44.4 g (0.1 mol) of 6FDA were added at a dash with vigorous stirring, and continuously stirred for an hour. 50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction solution was isolated by precipitation into methanol and then it was filtered and dried. Thus 65 g of yellow powder was yielded.

This yellow powder was dissolved in 500 g of NMP, and 7.83 g (0.05 mol) of 2-furan acrylic acid chloride and 8.4 g of pelargonic acid chloride were added. Then the solution was stirred at room temperature for 30 minutes and at 120° C. for 3 hours under a nitrogen atmosphere.

After the reaction, the reaction product was isolated by precipitation into methanol, and then it was filtered and dried. Thus 75 g of white powder (polyimide having furan acrylic acid) was yielded. The physical properties of the thus-obtained polyimide are shown in TABLE 1.

Example 11

(Synthesis of 1,4-bis(3-nitrophenooxy)-2-butancinnamate)

52.2 g (0.15 mol) of the above 1,4-bis(3-nitrophenooxy)-2-butanol, 33.3 g (0.2 mol) of cinnamoyl chloride, and 800 ml of o-dichlorobenzene were placed in a reaction vessel, and they were reacted at 130° C. for 3 hours under a nitrogen atmosphere. The solution was freed of solvent under reduced pressure and purified by column chromatography. Thus 57.4 g (0.12 mol) of 1,4-bis(3-nitrophenooxy)-2-butancinnamate.

(Sinthesis of 1,4-bis(3-aminophenoxy)-2-butancinnamate)

23.9 g (50 millimol) of 1,4-bis(3-nitrophenoxy)-2-butancinnamate, 5 g of 5%-platinum-containing carbon black (about 50% hydrate: a catalyst comprising platinum on carbon black support), and 100 ml of 1,4-dioxane were placed in a reaction vessel (hydrogeneration apparatus) and they were heated to 60° C. under a hydrogen atmosphere, with stirring. 7.2 litters of hydrogen was absorbed for 4 hours, and as hydrogen was no longer absorbed, the reaction was stopped. Then the reaction solution was isolated by filtration. After removing the platinum-containing carbon, the filtered solution was concentrated and recrystallized, and thus 20.9 g of 1,4-bis(3-aminophenoxy)-2-butancinnamate was yielded.

(Synthesis of polyimide)

250 g of DMAc was placed in a 2000 ml separable flask equipped with a nitrogen introducing tube and a stirrer. 10.45 g (0.05 mol) of the synthesized 1,4-bis(3-aminophenoxy)-2-butancinnamate, 18.32 g (0.05 mol) of 2,2-bis(3-amino-4-hydroxyphenyl)hexafluoropropane, and 4.4 g (0.1 mol) of 6FDA were added at a dash with vigorous stirring, and continuously stirred for an hour. 50 g of toluene and 100 g of DMAc were added to the above reaction solution and heated to about 150° C. Then the water formed by imidization reaction was removed by azeotropy, and the reaction was continuously conducted until water was not generated anymore. After the reaction, the reaction solution was isolated by precipitation into methanol, and then it was filtered and dried. Thus 68 g of white solid was yielded.

65 g of white solid was dissolved in 500 g of NMP, and 8.4 g of pelargonic acid chloride was added and stirred at a room temperature for 30 minutes and at 120° C. for 3 hours under a nitrogen atmosphere. After the reaction, the reaction solution was isolated by precipitation into methanol, and then it was filtered and dried. Thus 68 g of white powder (polyimide having cinnamoyl group and an alkyl group) was yielded. The physical properties of the thus-obtained polyimide are shown in TABLE 1.

Comparative Example 1

Polyimide composition was obtained by the reaction of equal mols of PMDA and ODA in the same manner as EXAMPLE 1. The physical properties of the thus-obtained polyimide are shown in TABLE 1. Since this composition is not soluble in water, polyamic acid solution was cast into films on a glass plate and heated at 100° C. for 30 minutes. Then it was stripped off from the glass plate to obtain a self-supporting film. The film was secured to a pin frame and heated at 200° C. for 30 minutes, at 300° C. for 30 minutes, and at 400° C. for 10 minutes. Then water absorption of the film was measured.

TABLE 1

|  | Average molecular weight | Tg (° C.) | Water absorption (%) |
| --- | --- | --- | --- |
| EXAMPLE 1 | 100,000 | 190 | 0.4 |
| EXAMPLE 2 | 95,000 | 160 | 0.3 |
| EXAMPLE 3 | 90,000 | 180 | 0.4 |
| EXAMPLE 4 | 110,000 | 170 | 0.5 |
| EXXXPLE 5 | 120,000 | 170 | 0.5 |
| EXAMPLE 6 | 120,000 | 190 | 0.5 |
| EXAMPLE 7 | 130,000 | 180 | 0.4 |
| EXAMPLE 8 | 100,000 | 160 | 0.3 |
| EXAMPLE 9 | 100,000 | 170 | 0.4 |
| EXAMPLE 10 | 110,000 | 180 | 0.3 |
| EXAMPLE 11 | 85,000 | 160 | 0.6 |
| COMPARATIVE EXAMPLE 1 |  | unknown | 3.0 |

Example 12 to 22

Polyimide compositions were produced using 20 wt % of any one of polyimides having photosensitive groups, which were yielded in Examples 1 to 11, and 80 wt % of polyimide yielded in COMPARATIVE EXAMPLE 1. All the polyimide compositions thus obtained showed excellent light-reactivity.

There has thus been shown and described polyimides, polyimide compositions and a process for their preparation which fulfill all the objects and advantages sought therefor. Many changes, modifications, variations and other uses and applications of the subject invention will, however, become apparent to those skilled in the art after considering this specification which disclose the preferred embodiments thereof. All changes, modifications, variations and other use and applications which do not depart from the spirit or scop of the present invention are deemed to be covered by the invention, which is to be limited only by the claims which follow.

What is claimed is:

1. A polyimide represented by the following general formula (1):

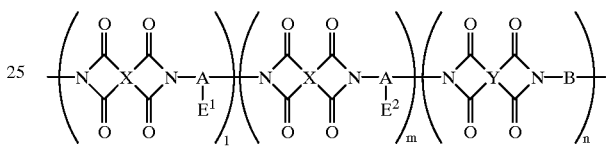

wherein 1, m, and n represent not the order of each repeating unit, but the numbers of each repeating unit existing in the molecule; and $E^1$ a photosensitive group; $E^2$ is a group comprising an alkyl group having 2 to 20 carbon atoms; —A(—$E^1$)—, —A(—$E^2$)—, and B represents a divalent organic group; X and Y each are a tetravalent organic group; and X, Y, A, B, $E^1$ and $E^2$ may be identical or different among their repeating units when any one of l, m and n is 2 or more, l is an integer of 1 or more, or m and n each are an integer of 0 or more.

2. A polyimide according to claim 1, wherein $E^1$ is at least one kind of photosensitive groups selected from the group consisting of cinnamic acid derivatives, cinnamylidene-acetyl derivatives, chalcone derivatives, stilpyridine derivatives, furylacroyl derivatives, coumarin derivatives, pyrone derivatives and stilbene derivatives.

3. A polyimide according to claim 1, wherein $E^1$ is at least one kind of photosensitive groups selected from the following group (I):

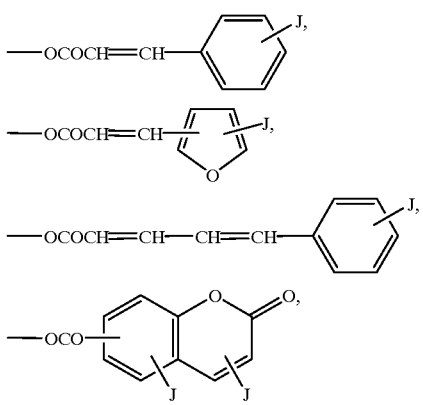

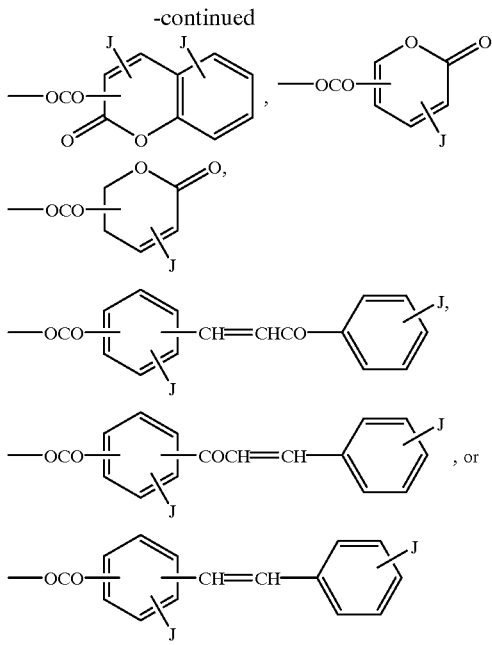

wherein J represents H, CH$_3$, CH$_3$O, F, Cl Br or I.

4. A polyimide according to claim 1, wherein the bond of E$^2$ to A in the general formula (1) is an ester bond, a sulfonate bond or an ether bond.

5. A polyimide according to claim 4, wherein the alkyl group contained in E$^2$ in the general formula (1) is a fluoroalkyl group represented by —C$_n$H$_x$F$_y$—, wherein n, x and y each are an integer, n is 2 or more and 20 or less, x is 0 or more and 5 or less, and the relationship of x+y=2n+1 is satisfied.

6. A polyimide according to any one of claims 1 to 5, wherein —A(—E$^1$)— and/or —A(—E$^2$)— represent(s)

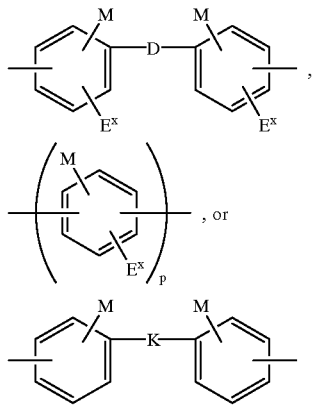

wherein

M represents H, CH$_3$, CH$_3$O, F, Cl Br or I;
E$^x$ represents E$^1$ or E$^2$;
D represents a single bond, —C(CF$_3$)$_2$—, —C(CH$_3$)$_2$—, —O—, —S—, —SO$_2$—, —CH$_2$—, or —CO—;
K represents —C$_n$H$_{2n-1}$(—E$^x$)$_2$—, —O—C$_n$H$_{2n-2}$(—E$^x$)$_2$, —O—, C$_n$H$_{2n-1}$(—E$^x$)—, —O—C$_n$H$_{2n-1}$(E$^x$)—O—, or

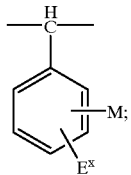

p is an integer of 1 to 3; and
n is an integer of 1 to 20.

7. A polyimide composition comprising 20 wt % or more of polyimide according to any one of claims 1 to 5.

8. A polyimide composition comprising 20 wt. % or more of polyimide as set forth in claim 6.

9. A polyimide according to claim 8, wherein at least one of X or Y in the general formula (1) comprises 1 to 3 aromatic rings, or an alicyclic group.

10. A polyimide according to claim 9, wherein B in the general formula (1) comprises 1 to 4 aromatic rings, or an alicyclic or siloxane bond.

11. A process for producing a polyimide, in which the polyimide represented by the general formula (1):

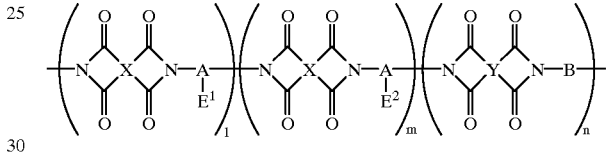

wherein 1, m, and n represent not the order of each repeating unit, but the numbers of each repeating unit existing in the molecule; and E$^1$ is a photosensitive group; E$^2$ is a group comprising an alkyl group having 2 to 20 carbon atoms; —A(—E$^1$)—, —A(—E$^2$)—, and B each represent a divalent organic group; X and Y each are a tetravalent organic group; and X, Y, A, B, E$^1$ and E$^2$ may be identical or different among their repeating units when any one of 1, m and n is 2 or more, 1 is an integer of 1 or more, or m and n each are an integer of 0 or more is obtained by, synthesizing a copolymer of the following general formula (2)

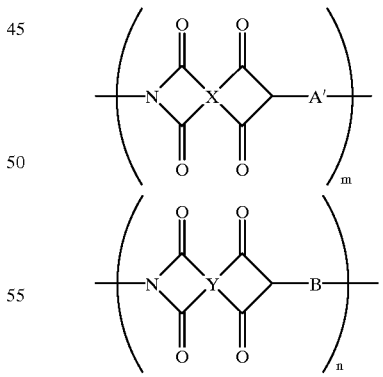

where m and n represent not the order of each repeating unit, but the numbers of each repeating unit existing in the molecule, and X and Y each are a tetravalent organic group, A' is a divalent organic group comprising at least one hydroxyl group, B is a divalent organic group, X and Y may be identical or different among the repeating units when m is 2 or more, m is an integer of 1 or more, n is an integer of 0 or more; and subsequently introducing photosensitive groups and/or groups containing an alkyl group having 2 to 20 carbon atoms.

12. A process for producing a polyimide according to claim 11, wherein —A'— in the general formula (2) represents

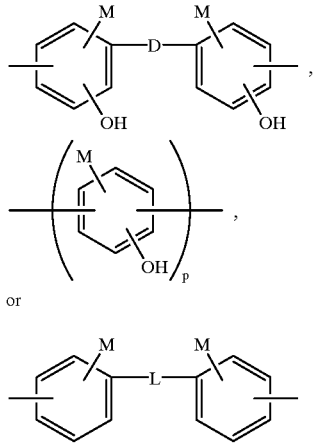

or

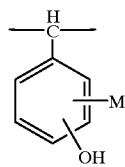

wherein

M represents H, $CH_3$, $CH_3O$, F, Cl, Br or I;

D represents a single bond, $-C(CF_3)_2-$, $-C(CH_3)_2-$, $-O-$, $-S-$, $-SO_2-$, $-CH_2-$, or $-CO-$;

L represents $-C_nH_{2n-2}(-OH)_2-$, $-O-C_nH_{2n-1}(-OH)-$, $-O-$, $C_nH_{2n-1}(-OH)-O-$, or p is an integer of 1 to 3; and n is an integer of 1 to 20.

13. A process for producing a polyimide, in which the polyimide represented by the general formula (1)

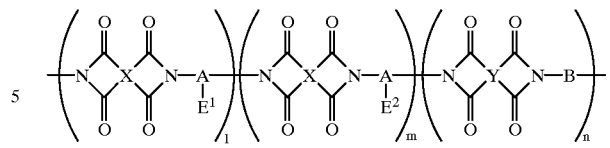

wherein l, m, and n represent not the order of each repeating unit, but the numbers of each repeating unit existing in the molecule; and $E^1$ is a photosensitive group; $E^2$ is a group comprising an alkyl group having 2 to 20 carbon atoms; $-A(-E^1)-$, $-A(-E^2)-$, and B each represent a divalent organic group; X and Y each are a tetravalent organic group; and X, Y, A, B, $E^1$ and $E^2$ may be identical or different among their repealing units when any one of l, m and n is 2 or more, 1 is an integer of 1 or more, or m and n each are an integer of 0 or more is synthesized by reacting a diamine, to which a photosensitive group is introduced, with an acid dianhydride.

14. A process for producing a polyimide, in which the polyimide represented by the general formula (1)

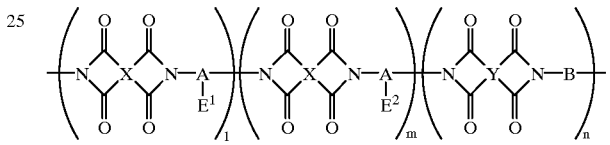

wherein l, m, and n represent not the order of each repeating unit, but the numbers of each repeating unit existing in the molecule; and $E^1$ is a photosensitive group; $E^2$ is a group comprising an alkyl group having 2 to 20 carbon atoms; $-A(-E^1)-$, $-A(-E^2)-$, and B each represent a divalent organic group; X and Y each are a tetravalent organic group; and X, Y, A, B, $E^1$ and $E^2$ may be identical or different among their repealing units when any one of l, m and n is 2 or more, 1 is an integer of 1 or more, or m and n each are an integer of 0 or more is synthesized by reacting a diamine, to which a photosensitive group is introduced, and a diamine, to which a group containing an alkyl group having 2 to 20 carbon atoms is introduced, with an acid dianhydride.

* * * * *